United States Patent [19]

Hickman et al.

[11] Patent Number: 5,452,245
[45] Date of Patent: Sep. 19, 1995

[54] MEMORY EFFICIENT GATE ARRAY CELL

[75] Inventors: Patrick Hickman; Stephen W.-Y. Lai, both of Chandler, Ariz.

[73] Assignee: Motorola, Inc., Schaumburg, Ill.

[21] Appl. No.: 124,651

[22] Filed: Sep. 7, 1993

[51] Int. Cl.6 ............................................. G11C 11/40
[52] U.S. Cl. .................................... 365/154; 365/156; 257/206
[58] Field of Search ................ 365/154, 156; 257/204, 257/206, 208, 903, 355, 296

[56] References Cited

U.S. PATENT DOCUMENTS

| | | | |
|---|---|---|---|
| 5,157,625 | 10/1992 | Barry | 365/154 |
| 5,272,097 | 12/1993 | Shiota | 257/355 |
| 5,281,842 | 1/1994 | Yasuda et al. | 257/371 |
| 5,289,021 | 2/1994 | El Gamal | 257/206 |

Primary Examiner—David C. Nelms
Assistant Examiner—A. Zarabian
Attorney, Agent, or Firm—Gary W. Hoshizaki

[57] ABSTRACT

A core cell (10) for a gate array circuit has been provided. The core cell has a transistor layout that facilitates efficient memory circuit design within the gate array. The core cell includes a first (14–22) and second (23–31) plurality of transistors of a first conductivity type, and a third plurality (52–63) of transistors of a second conductivity type wherein the third plurality of transistors are positioned between the first and second plurality of transistors. The third plurality of transistors having transistors of a first and second size wherein at least two transistors of the second size of the third plurality of transistors includes a common gate connection.

9 Claims, 4 Drawing Sheets

MEMORY EFFICIENT GATE ARRAY CELL

FIELD OF THE INVENTION

This invention relates to gate arrays and, in particular but not limited to, a memory efficient gate array cell.

BACKGROUND OF THE INVENTION

A gate array typically includes an inner core cell area which is comprised of a plurality of cells. Each of the plurality of cells include a plurality of transistors. A gate array designed in this fashion is typically referred to as a sea of cells gate array or a sea of transistors gate array.

Typically, sea of cells gate arrays are implemented with a core cell which includes both PMOS and NMOS transistors all of which are substantially equal in size. However, this structure limits the capability of the gate array to implement efficient and stable memory structures. Moreover, such a structure also limits the flexibility to make speed/power/area tradeoffs when constructing logic macros. For example, if only one transistor size is available, it becomes difficult to balance rising and falling propagation delays or to manage dynamic power dissipation.

Hence, there exists a need for an improved gate array architecture having a core cell which is both memory and logic efficient.

DETAILED DESCRIPTION OF THE DRAWINGS

Figure 1:
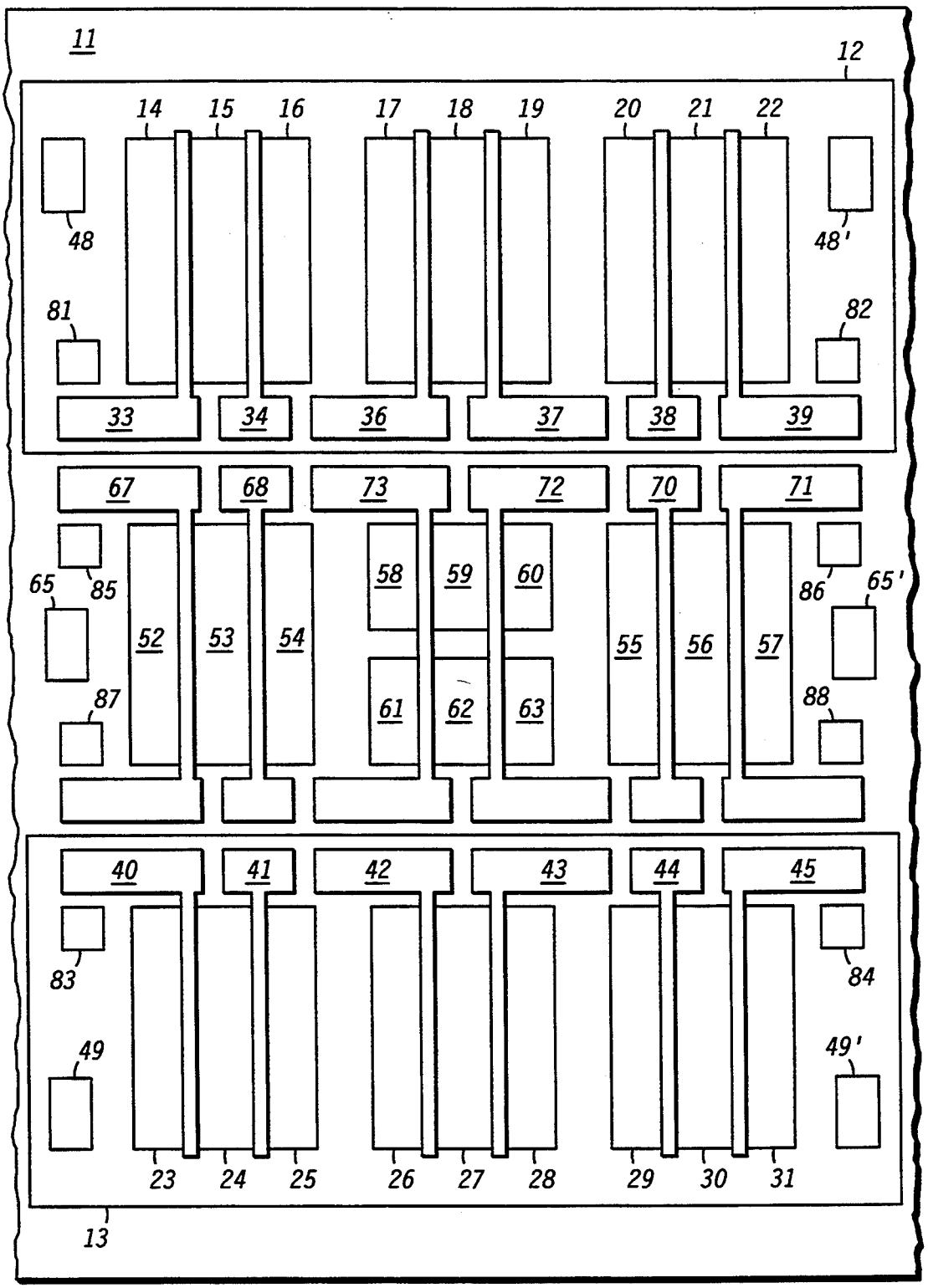
FIG. 1 is a detailed pictorial diagram illustrating an architecture of a core cell of a gate array in accordance with the present invention.

Referring to FIG. 1, a detailed pictorial diagram illustrating an architecture of memory efficient core cell 10 is shown. It is understood that core cell 10 is one of a plurality of core cells within an inner core cell area of a gate array. Core cell 10 includes n-well regions 12 and 13 which are formed within a p-type semiconductor substrate, a portion of which is shown as indicated by reference number 11. P-type regions 14–22 and 23–31 are respectively formed within n-well regions 12 and 13 for forming a plurality of PMOS transistors. Moreover, poly-silicon regions 33–39 and 40–45 are respectively formed on n-well regions 12 and 13 for providing gate contacts to the plurality of PMOS transistors.

In particular, regions 14, 15 and 16 along with poly-silicon regions 33 and 34 comprise two PMOS transistors. That is, region 14 may function as a drain of a first transistor while region 15 would then function as a source of the first transistor. Moreover, region 16 would then function as a drain of a second transistor wherein region 15 also functions as the source of the second transistor. Further, poly-silicon region 33 functions as the gate of the first transistor while region 34 functions as the gate of the second transistor. However, it is understood that region 14 and 16 could function as the sources of the first and second transistor, respectively, wherein region 15 would then be the common drain region for both transistors.

It is understood that regions 17–19, 20–22, 23–35, 26–28 and 29–31 along with their respective poly-silicon regions as denoted by regions 36–45 are identical to the aforedescribed pair of transistors comprised of regions 14–16 and poly-silicon regions 33 and 34. Thus, n-well regions 12 and 13 each include six PMOS transistors which, in a preferred embodiment, are all identical size.

Figure 2:
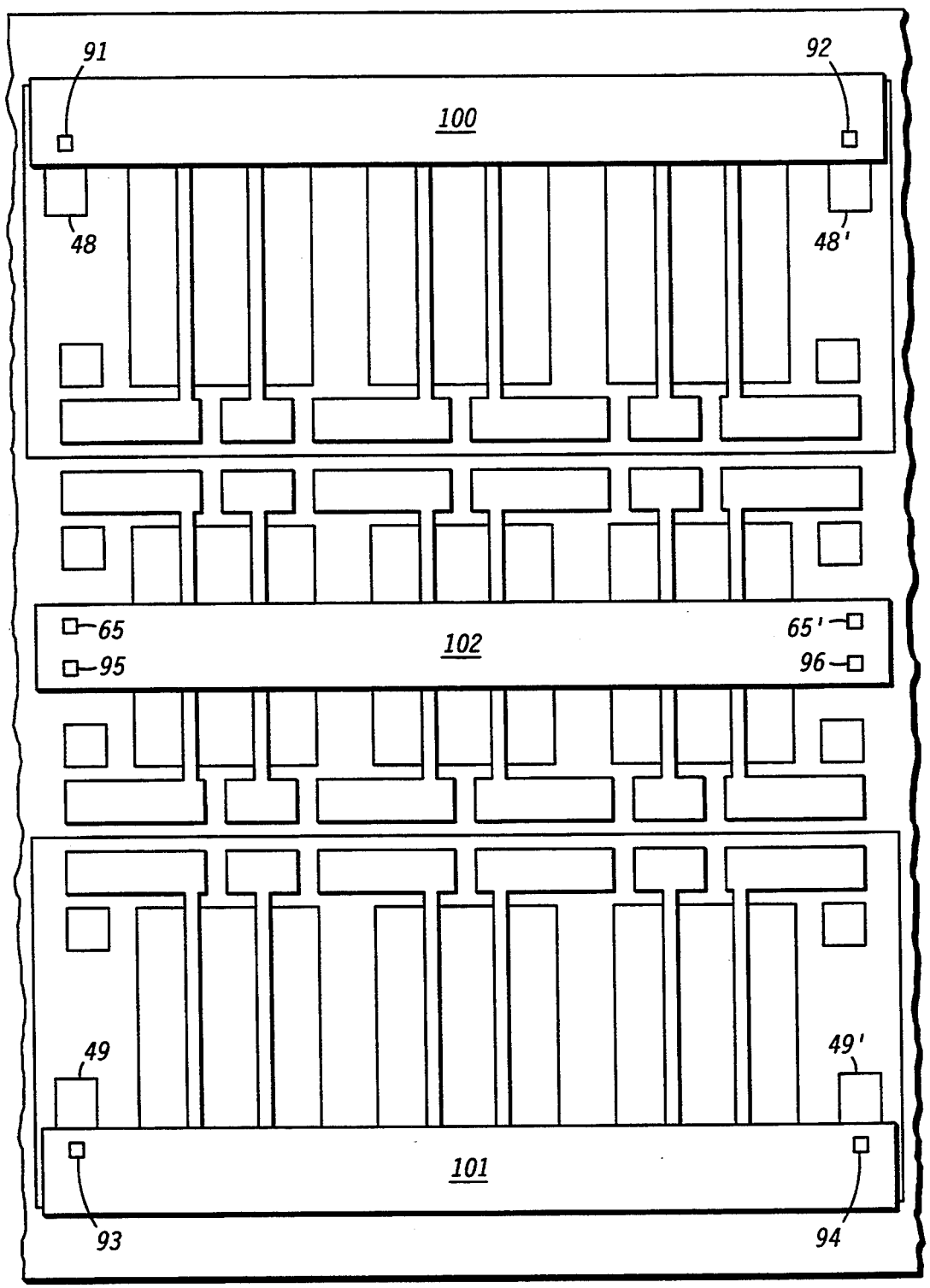
FIG. 2 is a pictorial diagram of the core cell shown in FIG. 1 having metalized power supply conductors.

Moreover, n-type regions 12 and 13 respectively include contact areas 48 and 48', and 49 and 49' which are utilized in a well known manner for coupling regions 12 and 13 to a most positive supply voltage applied to the gate array as will be shown in FIG. 2.

Core cell 10 also includes a plurality of NMOS transistors which are located between the plurality of PMOS transistors included in n-well regions 12 and 13. In particular, n-type regions 52–63 are formed within a p-type region which, in a preferred embodiment, is the p-type substrate of the gate array wherein n-type regions 52–63 are utilized to form the plurality of NMOS transistors. Moreover, poly-silicon regions 68–73 and 40–45 are formed on the substrate for providing gate contacts to the plurality of NMOS transistors. Also, contact areas 65 and 65' are are utilized in a well known manner for coupling p-type substrate 11 to a most negative supply voltage applied to the gate array as will be shown in FIG. 2.

In particular, N-type regions 52–54 along with poly-silicon regions 67 and 68 comprise two NMOS transistors in a similar manner as did p-type regions 14–16 and poly-silicon regions 33 and 34 comprised two PMOS transistors. For example, regions 52 and 54 may function as drains for first and second transistors while region 53 would then function as the source for both these transistors. Further, polysilicon regions 67 and 68 would then function as the gate contact for the first and second transistors, respectively.

Likewise, it is understood that n-type regions 55–57 along with poly-silicon regions 70 and 71 are identical to n-type regions 52–54 and their respective poly-silicon regions 67 and 68. Thus, core cell 10 includes four NMOS transistors formed between the PMOS transistors that are formed in n-well regions 12 and 13, and, in a preferred embodiment, are identical in size to the PMOS transistors. That is, regions 14–31 are substantially the same size as regions 52–57.

In addition, core cell 10 includes four more NMOS transistors which, in a preferred embodiment, are substantially one half the size of the other NMOS transistors as well as the PMOS transistors in core cell 10. In particular, regions 58–63 along with poly-silicon regions 72 and 73 comprise four NMOS transistors. Further, it is worth noting that a first transistor within the transistor pair formed from n-type regions 58–60 has its gate electrode common with the gate electrode of a first transistor formed from n-type regions 61–63 as indicated by common poly-silicon region 73. Similarly, a second transistors formed from n-type regions 58–60 shares a common gate electrode with a second transistor formed from n-type regions 61–63 as indicated by common poly-silicon region 72. As will be shown later, these common gate electrodes between these two pairs of smaller NMOS transistors will be advantageous and efficient when implementing memory circuits within core cell 10 and wherein these smaller NMOS transistors may be conveniently utilized as pass transistors for a memory circuit.

Core cell 10 further includes a plurality of electrostatic discharge (ESD) diodes strategically positioned within core cell 10 so as to be a minimum distance from all poly-silicon regions. In particular, p-type regions 81 and 82 are formed within n-region 12 to form diodes. Similarly, p-type regions 83 and 84 are formed in n-region 13 to form diodes. In addition, n-type regions 85–88 are formed within p-substrate 11 of core cell 10 thereby forming four additional diodes.

During fabrication, a device undergoes processing steps where it is bombarded by high energy ions (during various depositions, etchings and implants). Any poly-silicon or metal that is exposed to this will act as an antenna and collect charge as is well known. If the antenna structure is connected to a diffusion, the diffusion typically acts as a diode to shunt any current that is due to a charge build up. However, if the antenna structure is not connected to a diffusion and is instead connected to a gate, most of the charge will collect on the gate because of its higher capacitance. Further, if the gate is small, the electric field caused by this collection of charge will be quite large and can damage the active gate. This damage typically manifests itself as a leakage which gets worse with time.

In response to this problem, the present invention provides a plurality of diodes (as denoted by p-type regions 81–82, 83–84 and n-type regions 85–88 which are respectively formed in regions 12, 13 and 11) which, during the first processing step of the gate array, are coupled to the inputs of all macros thereby acting as a diffusion to shunt any current due to charge build up thereby protecting the gate oxides of the input devices. In this manner, these diodes provide in-process ESD protection for gate oxides.

Referring to FIG. 2, there is illustrated core cell 10 of FIG. 1 having a plurality of metalized power supply conductors formed thereon. It is understood that components shown in FIG. 2 which are identical to components shown in FIG. 1 are identified by the same reference numbers. In a preferred embodiment, power supply conductor 100 is placed across a top portion of n-type region 12 for providing a first voltage, for example, $V_{DD}$, thereat. Further, power supply conductor 101 is positioned across the bottom portion of n-type region 13 for providing the first voltage thereat. Also, power supply conductor 102 is positioned across the center of n-type regions 52–57 for providing a second voltage, for example, $V_{SS}$, thereat. Note that contact areas 48 and 48' are coupled to power supply conductor 100 as respectively denoted by vias 91 and 92. This essentially biases n-well region 12 to voltage $V_{DD}$. Similarly, contact areas 49 and 49' are coupled to power supply conductor 101 as respectively denoted by vias 93 and 94. This essentially biases n-well region 13 to voltage $V_{DD}$. Finally, contact areas 65 and 65' are coupled to power supply conductor 102 as respectively denoted by vias 95 and 96. This essentially biases the p-type substrate to voltage $V_{SS}$.

Figure 3:
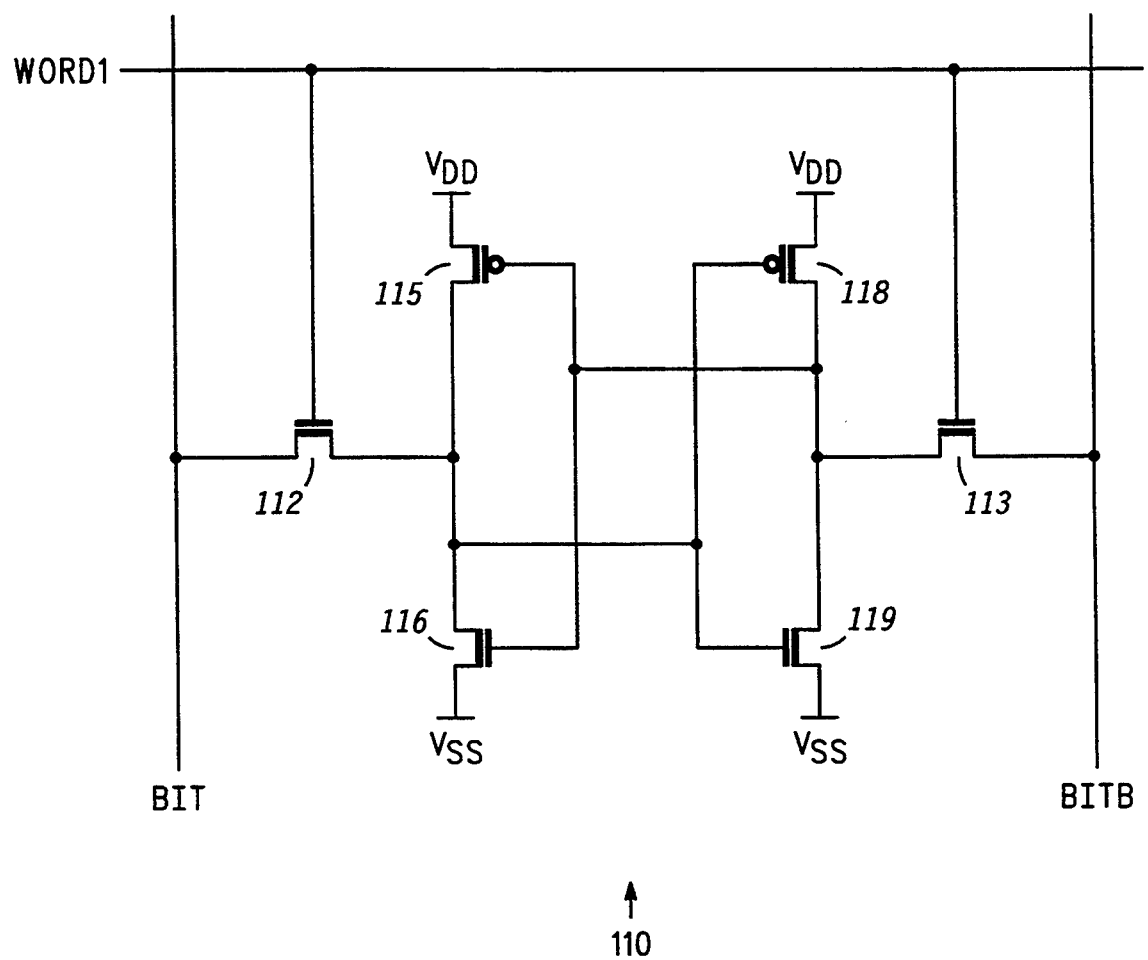
FIG. 3 is a detailed schematic diagram illustrating a single port RAM circuit.

Referring to FIG. 3, there is illustrated a detailed schematic diagram of single port RAM 110. RAM 110 includes pass NMOS transistors 112 and 113 each having their gate electrodes coupled to word line WORD1. A first current carrying electrode of transistors 112 and 113 are respectively coupled to BIT and BITB lines. The second current carrying electrode of transistor 112 is coupled to the first current carrying electrodes of transistors 115 and 116. Similarly, the second current carrying electrode of transistor 113 is coupled to the first current carrying electrodes of transistors 118 and 119. The second current carrying electrodes of transistors 115 and 118 are coupled to a first supply voltage terminal at which the operating potential $V_{DD}$ is applied, while the second current carrying electrodes of transistors 116 and 119 are coupled to a second supply voltage terminal at which the operating potential $V_{SS}$ is applied. The control electrode of transistor 115 is coupled to the control electrode of transistor 116 and also to the second current carrying electrode of transistor 113. Similarly, the control electrode of transistor 118 is coupled to the control electrode of transistor 119 and to the second current carrying electrode of transistor 112.

The operation of FIG. 3 is well known in the art and no description is deemed necessary.

Figure 4:
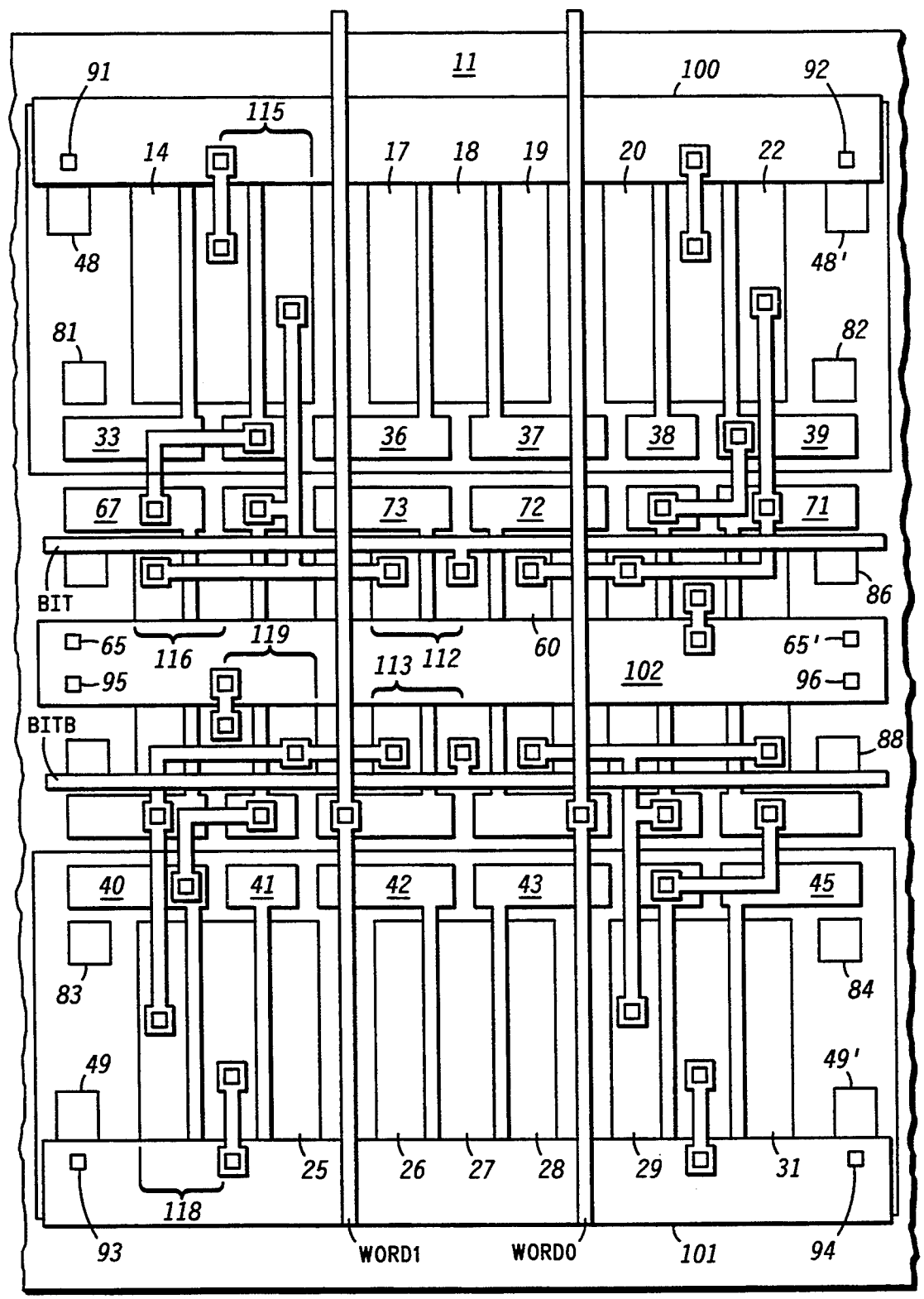
FIG. 4 is a detailed pictorial diagram illustrating an implementation of the single port RAM circuit shown in FIG. 3 utilizing the core cell shown in FIG. 1.

Referring to FIG. 4 a detailed pictorial diagram illustrating an implementation of two bits of single port RAM utilizing RAM 110 within core cell 10 is shown. Since RAM 110 of FIG. 3 shows a RAM circuit for one bit (bit and bitb) of a single port RAM, an implementation of two bits of single port RAM involves two circuits similar to RAM 110. It is understood that the components shown in FIG. 4 that are identical to components shown in the previous figures are identified by the same reference numbers.

The implementation of the transistors and circuit shown in FIG. 3 within core cell 10 are shown in FIG. 4 by corresponding reference numbers. Referring to the left potion of FIG. 4, circuitry for implementing the first bit of memory is shown. For example, NMOS pass transistor 112 is formed utilizing n-type regions 58 and 59 wherein region 58 functions as the second current carrying electrode of transistor 112, while region 59 functions as the first current carrying electrode of transistor 112. Moreover, poly-silicon region 73 functions as the control electrode for transistor 112. Likewise, NMOS pass transistor 113 is formed utilizing n-type regions 61 and 62 wherein region 61 functions as the second current carrying electrode of transistor 112, while region 62 functions as the first current carrying electrode of transistor 112. Moreover, poly-silicon region 73 also functions as the control electrode for transistor 113.

In addition, the other transistors corresponding to those in FIG. 3 are identified by the same reference numbers. Also, the right portion of FIG. 4 is identical to the left portion of FIG. 4 since the right portion implements the circuitry for the second bit.

From FIG. 4, it can be seen the advantage of common poly-silicon region 73 for n-type regions 58 and 159 and n-type regions 61 and 62 because their control electrodes are both coupled to the same word line. Moreover, transistors 112 and 113 need not be large devices since they are only pass transistors so it is also advantageous to have these transistors smaller than the others. Further, it can be seen that only one core cell was needed to implement a two-bit single port RAM. In comparison with the prior art that includes all equal size transistors, two core cells would be needed to implement a two-bit single port RAM. Thus, by including regions 58–63 and poly-silicon regions 72 and 73 within core cell 10, memory circuits such as RAM circuit 110 can be implemented more efficiently and in less area.

By now it should be apparent from the foregoing discussion that a novel core cell for a gate array circuit has been provided. The core cell has a transistor layout that facilitates efficient memory circuit design within the gate array. The core cell includes a first and second plurality of transistors of a first conductivity type, and a third plurality of transistors of a second conductivity type wherein the third plurality of transistors are positioned between the first and second plurality of transistors. The third plurality of transistors having transistors of a first and second size wherein at least two transistors of the second size of the third plurality of transistors includes a common gate connection.

While the invention has been described in specific embodiments thereof, it is evident that many alterations, modifications and variations will be apparent to those skilled in the art. Further, it is intended to embrace all such alterations, modifications and variations in the appended claims.

We claim:

1. A core cell for an inner core area of a gate array, the core cell comprising:
   a first plurality of transistors of a first conductivity type forming a first row of transistors;
   a second plurality of transistors of a second conductivity type forming a second row of transistors; and
   a third plurality of transistors of said first conductivity type forming a third row of transistors, said second row of transistors positioned between said first and second rows of transistors, a first portion of said second plurality of transistors having a first size and a second portion of said second plurality of transistors having a second size.

2. The core cell according to claim 1 wherein said first and third plurality of transistors are substantially the same size.

3. The core cell according to claim 1 wherein said first and third plurality of transistors and said first portion of said second plurality of transistors are substantially the same size.

4. The core cell according to claim 1 further including a plurality of diodes for providing in-process electrostatic discharge protection.

5. A core cell of a gate array, comprising:
   first and second regions of a first conductivity type (N) formed within a semiconductor substrate;
   first and second plurality of regions of a second conductivity type (P) formed within said first region;
   first and second plurality of poly-silicon regions wherein said first plurality of regions and said first plurality of poly-silicon regions are utilized to form a first plurality of transistors of said second conductivity type and wherein said second plurality of regions and said second plurality of poly-silicon regions are utilized to form a second plurality of transistors of said second conductivity type;
   a third plurality of regions of said first conductivity type formed within the semiconductor substrate and between said first and second plurality of regions, said third plurality of regions including a first portion having regions of a first size and a second portion having regions of a second size wherein said second size is smaller than said first size;
   a third plurality of poly-silicon regions wherein said first portion of said third plurality of regions and said third plurality of poly-silicon regions are utilized to form a third plurality of transistors of said first conductivity type; and
   a fourth plurality of poly-silicon regions wherein said second portion of said third plurality of regions and said fourth plurality of poly-silicon regions are utilized to form a fourth plurality of transistors of said first conductivity type, said fourth plurality of transistors including at least two transistors having a common poly-silicon region for providing a common gate connection.

6. The core cell according to claim 5 wherein said first and second plurality of regions and said first portion of said third plurality of regions are substantially the same size.

7. The core cell according to claim 5 further including a plurality of diodes formed within said first and second regions and the semiconductor substrate for providing in-process electrostatic discharge protection.

8. The core cell according to claim 1 wherein said first portion of said second plurality of transistors has a greater width than said second portion of said second plurality of transistors.

9. The core cell according to claim 1 wherein said second portion of said second plurality of transistors are centrally located within said second row of transistors.

* * * * *